United States Patent
Ekbote

(10) Patent No.: US 8,748,253 B1
(45) Date of Patent: Jun. 10, 2014

(54) MEMORY AND LOGIC WITH SHARED CRYOGENIC IMPLANTS

(71) Applicant: Texas Instruments Incorporated, Dallas, TX (US)

(72) Inventor: Shashank Sureshchandra Ekbote, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 13/901,856

(22) Filed: May 24, 2013

(51) Int. Cl.
*H01L 21/00* (2006.01)

(52) U.S. Cl.
USPC .............. 438/231; 438/275; 438/520

(58) Field of Classification Search
CPC .................................................. H01L 21/2253
USPC ................... 438/229–232, 275–277, 520
See application file for complete search history.

(56) References Cited

U.S. PATENT DOCUMENTS

| | | | |
|---|---|---|---|
| 6,482,714 B1 * | 11/2002 | Hieda et al. | 438/416 |
| 7,060,585 B1 * | 6/2006 | Cohen et al. | 438/355 |

* cited by examiner

*Primary Examiner* — Richard Booth
(74) *Attorney, Agent, or Firm* — Jacqueline J. Garner; Wade J. Brady, III; Frederick J. Telecky, Jr.

(57) ABSTRACT

An integrated circuit includes logic circuits of NMOS and PMOS transistors, and memory cells with NMOS and PMOS transistors. A common NSD implant mask exposes source and drain regions of a logic NMOS transistor and a memory NMOS transistor. The source and drain regions of the logic NMOS transistor and the memory NMOS transistor are concurrently implanted at a cryogenic temperature with an amorphizing species followed by arsenic. Phosphorus is concurrently implanted in the source and drain regions of the logic NMOS transistor and the memory NMOS transistor. The source and drain regions of the logic NMOS transistor are further implanted with phosphorus at a non-cryogenic temperature while the memory NMOS transistor is covered by a mask which blocks the phosphorus.

20 Claims, 18 Drawing Sheets

MEMORY AND LOGIC WITH SHARED CRYOGENIC IMPLANTS

FIELD OF THE INVENTION

This invention relates to the field of integrated circuits. More particularly, this invention relates to MOS transistors in integrated circuits.

BACKGROUND OF THE INVENTION

An integrated circuit may include logic circuits of n-channel metal oxide semiconductor (NMOS) transistors and p-channel metal oxide semiconductor (PMOS) transistors, and it may be desirable to form the logic circuits to operate at a high speed. The integrated circuit may also include memory cells which have NMOS transistors in each cell, and it may be desirable to form the memory cells so as to reduce leakage current. It may further be desirable to maintain fabrication costs of the integrated circuit below a desired limit.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit includes logic circuits of NMOS and PMOS transistors, and memory cells with NMOS transistors. Source and drain regions of a logic NMOS transistor and a memory NMOS transistor are concurrently implanted at a cryogenic temperature with an amorphizing species followed by arsenic. Phosphorus is concurrently implanted in the source and drain regions of the logic NMOS transistor and the memory NMOS transistor. The source and drain regions of the logic NMOS transistor are further implanted with phosphorus at a non-cryogenic temperature while the memory NMOS transistor is covered by a mask which blocks the phosphorus.

DETAILED DESCRIPTION OF EXAMPLE EMBODIMENTS

Figure 1A:
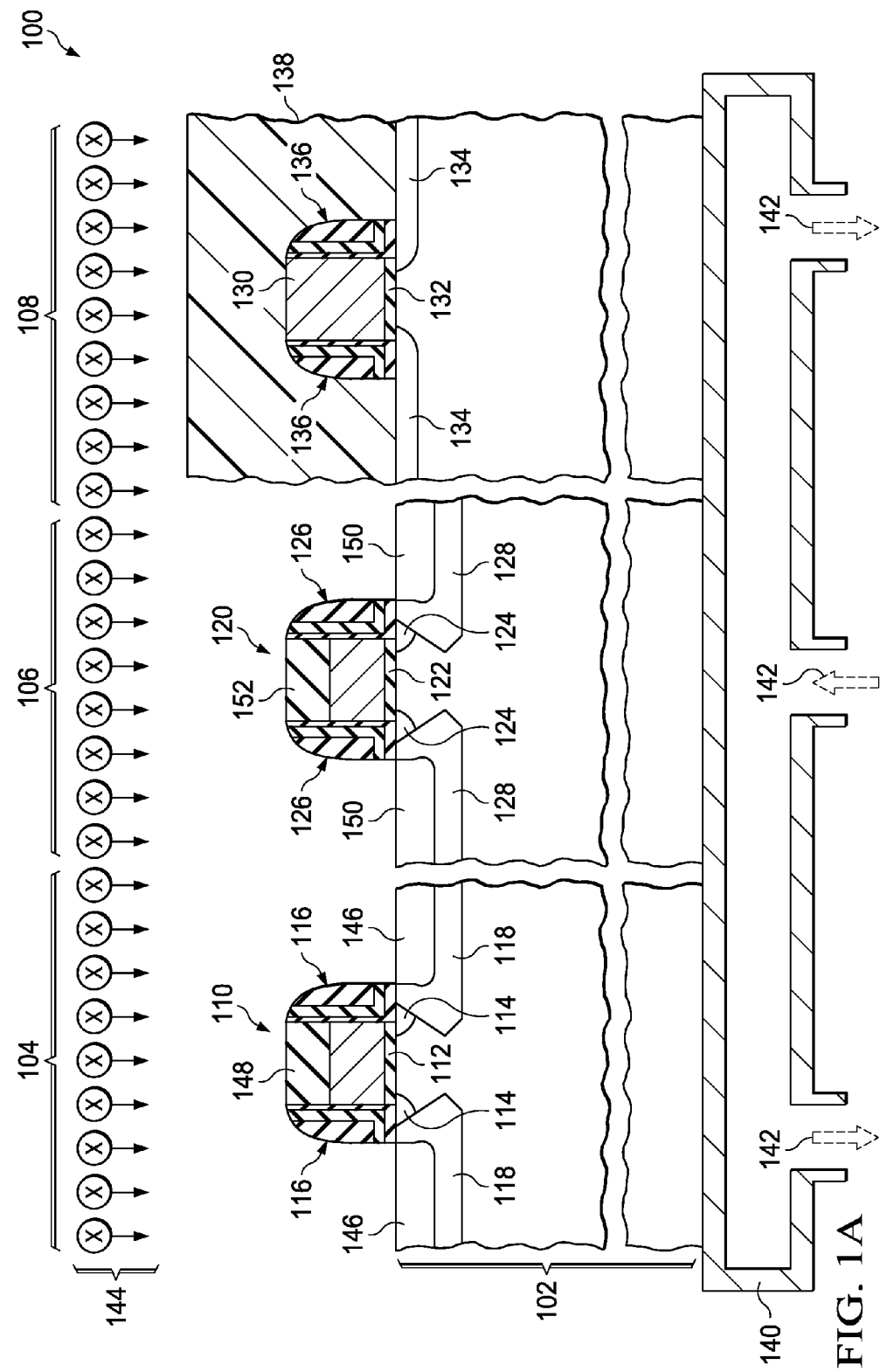
FIG. 1A through FIG. 1K are cross sections of an integrated circuit containing logic circuits and memory cells, formed according to an exemplary process sequence, depicted in successive stages of fabrication.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit includes logic circuits of NMOS and PMOS transistors, and memory cells with NMOS transistors. The logic circuits may include, for example, inverters, NAND gates, NOR gates, flip-flops, adders, multiplexers, and/or shift registers. The memory cells may be, for example, static random access memory (SRAM) cells, dynamic random access memory (DRAM) cells, flash memory cells, and/or ferroelectric random access memory (FRAM) cells.

A common n-channel source/drain (NSD) implant mask is formed which exposes a logic NMOS transistor and a memory NMOS transistor. Source and drain regions of the logic NMOS transistor and the memory NMOS transistor are concurrently implanted at a cryogenic temperature with an amorphizing species followed by arsenic. While the common NSD implant mask is in place, phosphorus is concurrently implanted in the source and drain regions of the logic NMOS transistor and the memory NMOS transistor, possibly at a cryogenic temperature or possibly at a non-cryogenic temperature.

A logic NSD implant mask is formed which exposes the logic NMOS transistor and covers the memory NMOS transistor. The source and drain regions of the logic NMOS transistor are implanted with phosphorus, and possibly also with arsenic, at a non-cryogenic temperature while the logic NSD implant mask is in place and blocks the phosphorus from the memory NMOS transistor.

In one example, the cryogenic implant of the amorphizing species and the arsenic into the logic and memory NMOS transistors may be done before the non-cryogenic implant of the phosphorus into the logic NMOS transistors. In another example, the non-cryogenic implant of the phosphorus may precede the cryogenic implant of the amorphizing species and the arsenic. An optional flash and/or laser anneal operation may be performed between the implants through the common NSD implant mask and the implants through the logic NSD implant mask. A laser anneal and possibly optional flash anneal is performed after the implants through the common NSD implant mask and the implants through the logic NSD implant mask are completed.

FIG. 1A through FIG. 1K are cross sections of an integrated circuit containing logic circuits and memory cells, formed according to an exemplary process sequence, depicted in successive stages of fabrication. Referring to FIG. 1A, the integrated circuit 100 is formed in and on a substrate 102 which may be, for example, a silicon wafer, a silicon-on-insulator (SOI) wafer, a hybrid orientation technology (HOT) wafer with different crystal orientations for various transistors, or other substrate suitable for forming the integrated circuit 100. The integrated circuit 100 includes a logic NMOS transistor 104, a memory NMOS transistor 106 and a PMOS transistor 108. It will be understood that reference to the integrated circuit 100 in this disclosure includes the integrated circuit 100 in successive stages of fabrication, as well as the completed integrated circuit 100, and similarly for reference to the logic NMOS transistor 104, the memory NMOS transistor 106 and the PMOS transistor 108.

The logic NMOS transistor 104 includes a gate 110, formed on a gate dielectric layer 112 on the substrate 102. The gate 110 may include primarily polycrystalline silicon, commonly referred to as polysilicon. The logic NMOS transistor 104 further includes n-channel lightly doped drain (NLDD) regions 114 formed in the substrate 102 adjacent to and extending under the gate dielectric layer 112. The logic NMOS transistor 104 also includes gate sidewall spacers 116 which include one or more dielectric layers on lateral surfaces of the gate 110. In one version of the instant example, the logic NMOS transistor 104 may include optional epitaxial source and drain regions 118 formed in the substrate 102 adjacent to the gate 110. The epitaxial source and drain regions 118 may include, for example, silicon with carbon to provide tensile stress to a channel region of the logic NMOS transistor 104.

The memory NMOS transistor 106 includes a gate 120, formed on a gate dielectric layer 122 on the substrate 102. The memory NMOS transistor 106 further includes NLDD regions 124 formed in the substrate 102 adjacent to and extending under the gate dielectric layer 122. The memory NMOS transistor 106 also includes gate sidewall spacers 126 similar to, and possibly formed concurrently with, the gate sidewall spacers 116 of the logic NMOS transistor 104. In one version of the instant example, the memory NMOS transistor 106 may include optional epitaxial source and drain regions 128 formed in the substrate 102 adjacent to the gate 120, similar to, and possibly formed concurrently with, the epitaxial source and drain regions 118 of the logic NMOS transistor 104. The epitaxial source and drain regions 128 of the memory NMOS transistor 106 may be formed even if no epitaxial source and drain regions are formed in the logic NMOS transistor 104. Conversely, the epitaxial source and drain regions 118 of the logic NMOS transistor 104 may be formed even if no epitaxial source and drain regions are formed in the memory NMOS transistor 106.

The PMOS transistor 108 includes a gate 130, formed on a gate dielectric layer 132 on the substrate 102. The PMOS transistor 108 further includes p-channel lightly doped drain (PLDD) regions 134 formed in the substrate 102 adjacent to and extending under the gate dielectric layer 132. The PMOS transistor 108 also includes gate sidewall spacers 136 formed on lateral surfaces of the gate 130; some sublayers of the gate sidewall spacers 136 of the PMOS transistor 108 may be formed concurrently with sublayers of the gate sidewall spacers 116 of the logic NMOS transistor 104 and the gate sidewall spacers 126 of the memory NMOS transistor 106. The PMOS transistor 108 may optionally include epitaxial source and drain regions, not shown, for example silicon germanium epitaxial source and drain regions to provide compressive stress in a channel region of the PMOS transistor 108.

A common NSD implant mask 138 is formed over the integrated circuit 100 so as to expose the logic NMOS transistor 104 and the memory NMOS transistor 106, and cover the PMOS transistor 108. The common NSD implant mask 138 may include, for example, photoresist and possibly an antireflection layer.

The integrated circuit 100 is disposed on a first cryogenic substrate holder 140, which cools the substrate 102. The first cryogenic substrate holder 140 may be cooled by flowing a cryogenic fluid 142 such as liquid nitrogen or a halogenated hydrocarbon through the first cryogenic substrate holder 140, as depicted schematically in FIG. 1A.

While the substrate 102 is cooled by the first cryogenic substrate holder 140, an amorphizing species 144, for example germanium, silicon, or argon, is implanted into the logic NMOS transistor 104 and the memory NMOS transistor 106, while the common NSD implant mask 138 blocks the amorphizing species 144 from the PMOS transistor 108. Implantation of the amorphizing species 144 forms amorphous layers 146 in the substrate 102 adjacent to the gate sidewall spacers 116 of the logic NMOS transistor 104, and may form an amorphous layer 148 in the gate 110. Similarly, implantation of the amorphizing species 144 forms amorphous layers 150 in the substrate 102 adjacent to the gate sidewall spacers 126 of the memory NMOS transistor 106, and may form an amorphous layer 152 in the gate 120. An exemplary dose range and energy range for the amorphizing species 144 may be $1\times10^{14}$ cm$^{-2}$ to $2\times10^{15}$ cm$^{-2}$ at 10 keV to 20 keV. While the amorphizing species 144 is implanted, the first cryogenic substrate holder 140 is maintained at a cryogenic temperature which is not higher than a maximum effective cryogenic temperature; the maximum effective cryogenic temperature is determined by the implant beam current density of the amophizing species implant process.

Figure 1B:
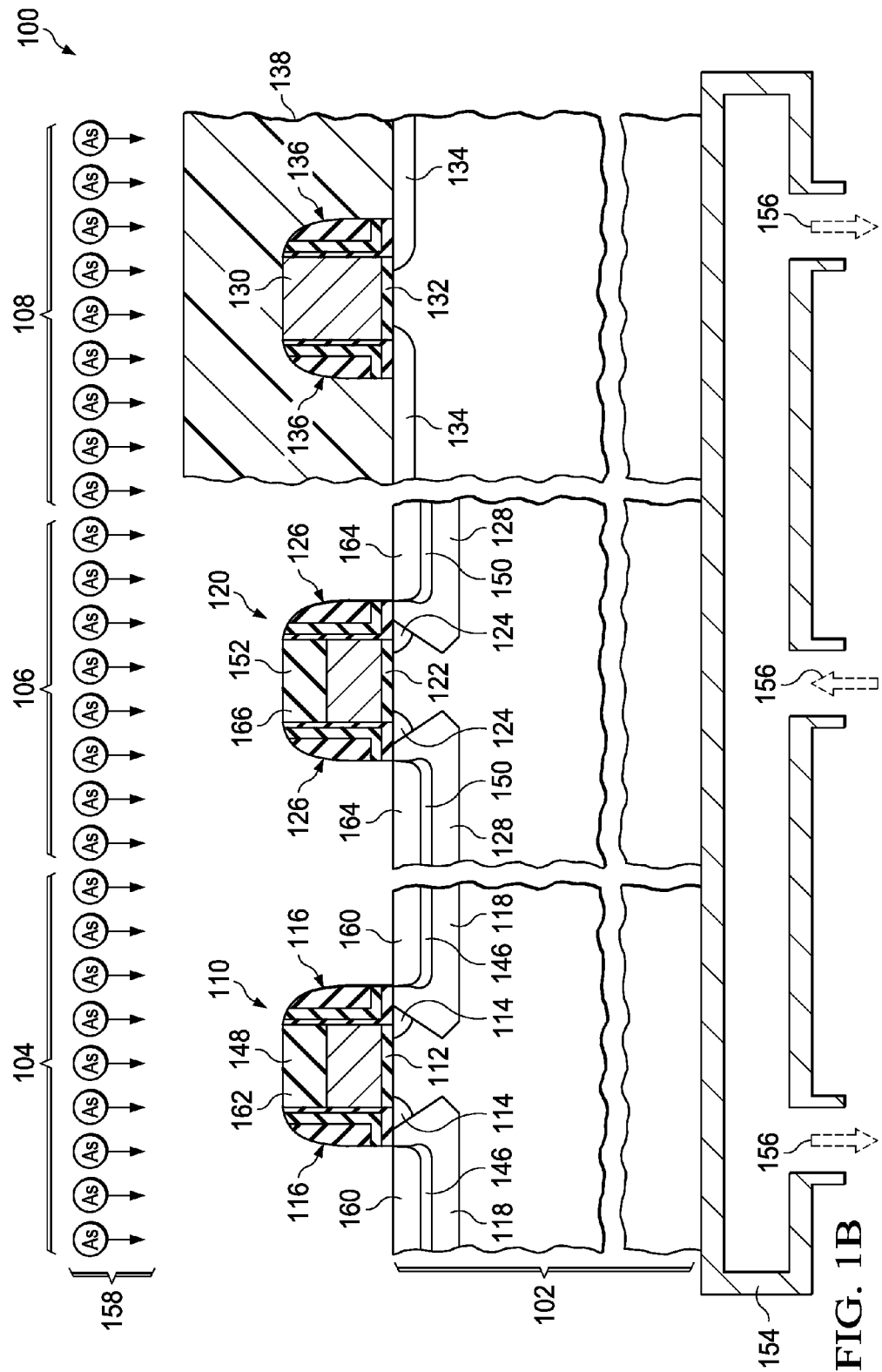

Referring to FIG. 1B, the integrated circuit 100 is disposed on a second cryogenic substrate holder 154, which cools the substrate 102, possibly using a cryogenic fluid 156. While the substrate 102 is cooled by the second cryogenic substrate holder 154, arsenic 158 is implanted into the logic NMOS transistor 104 and the memory NMOS transistor 106, while the common NSD implant mask 138 blocks the arsenic 158 from the PMOS transistor 108. Implantation of the arsenic 158 forms arsenic-doped layers 160 in the substrate 102 adjacent to the gate sidewall spacers 116 of the logic NMOS transistor 104 and within the amorphous layers 146, and may form an arsenic-doped layer 162 in the gate 110. Similarly, implantation of the arsenic 158 forms arsenic-doped layers 164 in the substrate 102 adjacent to the gate sidewall spacers 126 of the memory NMOS transistor 106 and within the amorphous layers 150, and may form an arsenic-doped layer 166 in the gate 120. An exemplary dose range and energy range for the arsenic 158 may be $5\times10^{14}$ cm$^{-2}$ to $1\times10^{16}$ cm$^{-2}$ at 10 keV to 20 keV. While the arsenic 158 is implanted, the second cryogenic substrate holder 154 is maintained at a cryogenic temperature which is equal to or colder than a maximum effective cryogenic temperature; the maximum effective cryogenic temperature is determined by the implant beam current density of the arsenic implant process. It will be recognized that the second cryogenic substrate holder 154 used for implanting the arsenic 158 may be the first cryogenic substrate holder 140 used for implanting the amorphizing species 144.

Implanting the amorphizing species 144 and the arsenic 158 while cooling the substrate 102 on the first cryogenic substrate holder 140 and the second cryogenic substrate holder 154, respectively, may desirably result in dislocation loops produced by the implant process being formed in the within the amorphous layers 146 and 150, which may advantageously provide reduced crystal defects after a subsequent anneal, compared to process sequences which implant amorphizing species and arsenic at non-cryogenic temperatures and produce dislocation loops outside of amorphous layers. The maximum effective cryogenic temperatures of the first cryogenic substrate holder 140 and the second cryogenic substrate holder 154 are determined by a selected value of an implant beam current density of the amorphizing species 144 and an implant beam current density of the arsenic 158; the relationship between a maximum effective cryogenic temperature $T_{max}$ in degrees C. and a corresponding implant beam current density $J_{beam}$ in milliamps/sq.cm may be expressed by an Arrhenius equation:

$$\log(J_{beam})=-(1020/(T_{max}+273))+4.898$$

where $\log(J_{beam})$ is the base 10 logarithm of $J_{beam}$

Figure 2:
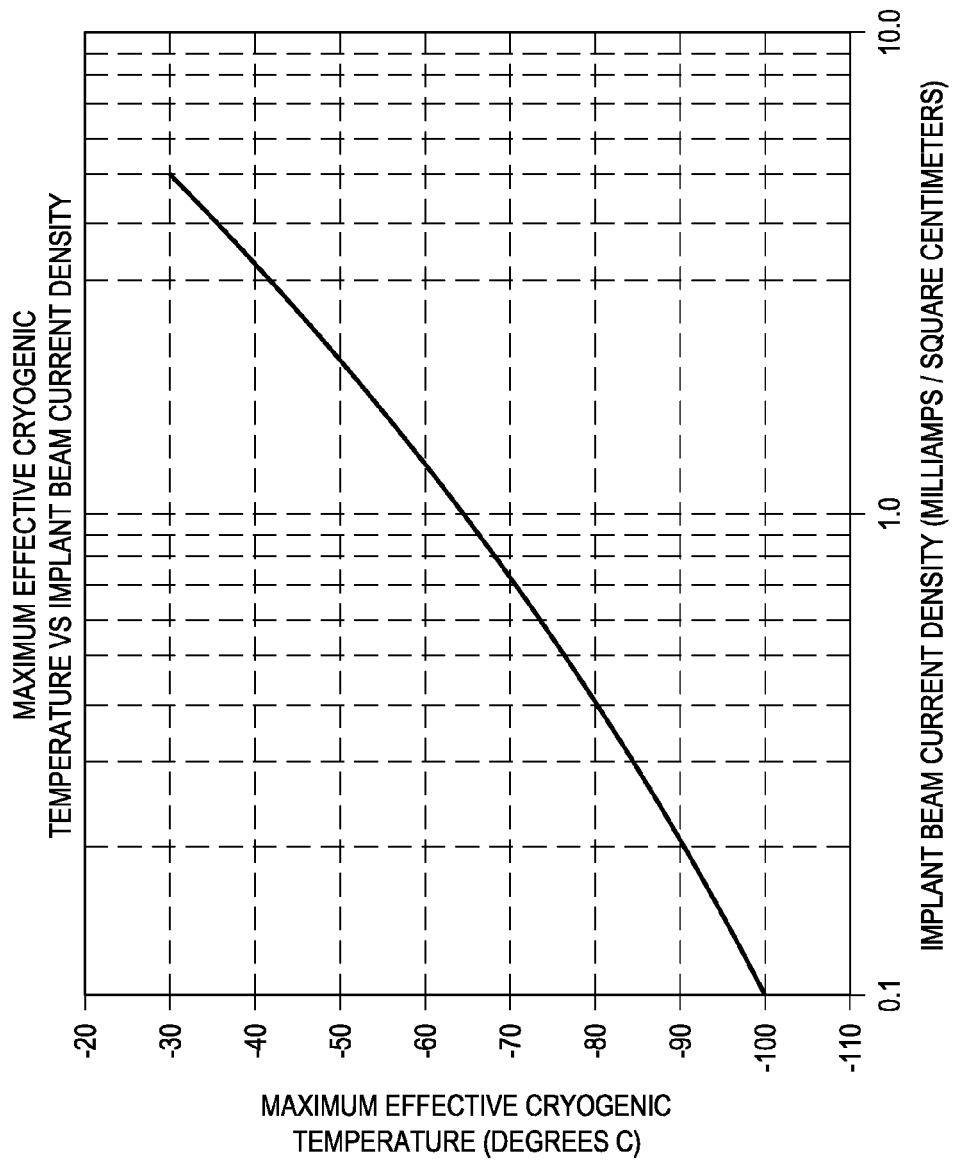
FIG. 2 is a chart of the maximum effective cryogenic temperature as a function of the implant beam current density.

For an implant beam current density of 0.1 milliamps/cm², the maximum effective cryogenic temperature is −100° C. (173° K). For an implant beam current density of 0.2 milliamps/cm², the maximum effective cryogenic temperature is −90° C. (183° K). For an implant beam current density of 0.5 milliamps/cm², the maximum effective cryogenic temperature is −77° C. (196° K). For an implant beam current density of 1 milliamp/cm², the maximum effective cryogenic temperature is −65° C. (208° K). For an implant beam current density of 2 milliamps/cm², the maximum effective cryogenic temperature is −51° C. (222° K). For an implant beam current density of 5 milliamps/cm², the maximum effective cryogenic temperature is −30° C. (243° K). A chart of the maximum effective cryogenic temperature as a function of the implant beam current density is shown in FIG. 2.

Figure 1C:
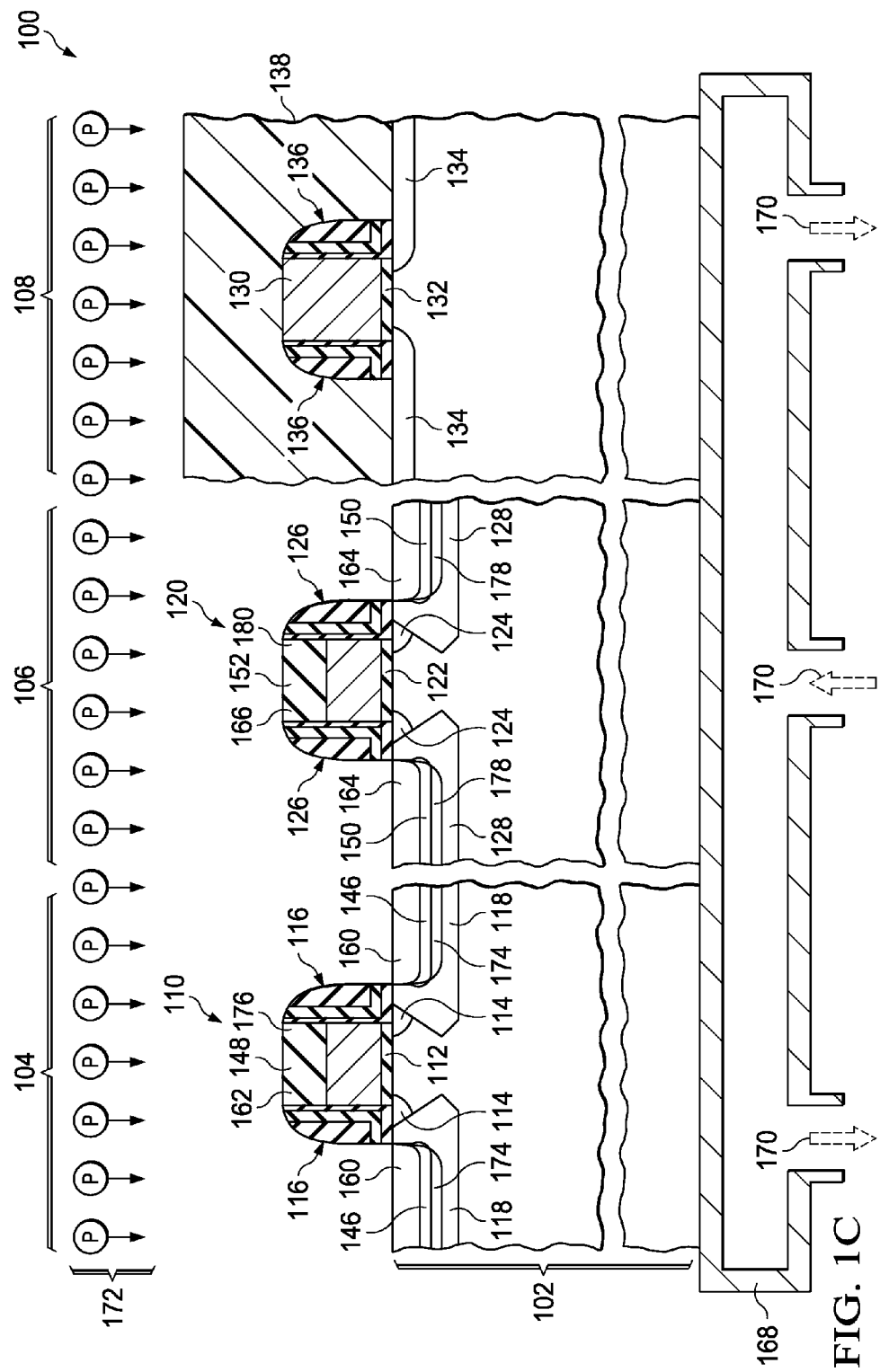

Referring to FIG. 1C, phosphorus 172 is implanted into the logic NMOS transistor 104 and the memory NMOS transistor 106, while the common NSD implant mask 138 blocks the phosphorus 172 from the PMOS transistor 108. In the instant example, the phosphorus 172 is implanted while the substrate 102 is cooled by a third cryogenic substrate holder 168, possibly cooled by a cryogenic fluid 170. The third cryogenic substrate holder 168 is at a cryogenic temperature of −25° C. (248° K) or colder. It will be recognized that the third cryogenic substrate holder 168 used for implanting the phosphorus 172 may be the second cryogenic substrate holder 154 used for implanting the arsenic 158 and/or the first cryogenic substrate holder 140 used for implanting the amorphizing species 144. Implantation of the phosphorus 172 forms phosphorus-doped layers 174 in the substrate 102 adjacent to the gate sidewall spacers 116 of the logic NMOS transistor 104 and overlapping the amorphous layers 146, and may form a phosphorus-doped layer 176 in the gate 110. Similarly, implantation of the phosphorus 172 forms phosphorus-doped layers 178 in the substrate 102 adjacent to the gate sidewall spacers 126 of the memory NMOS transistor 106 and overlapping the amorphous layers 150, and may form a phosphorus-doped layer 180 in the gate 120. An exemplary dose range and energy range for the phosphorus 172 may be $5 \times 10^{14}$ cm$^{-2}$ to $1 \times 10^{16}$ cm$^{-2}$ at 1 keV to 5 keV. Implanting the phosphorus 172 using the third cryogenic substrate holder 168 may accrue similar benefits as described for implanting the amorphizing species 144 and the arsenic 158 while cooling the substrate 102. The common NSD implant mask 138 is subsequently removed, for example by ashing followed by a wet clean in an aqueous mixture of sulfuric acid and hydrogen peroxide.

Figure 1D:
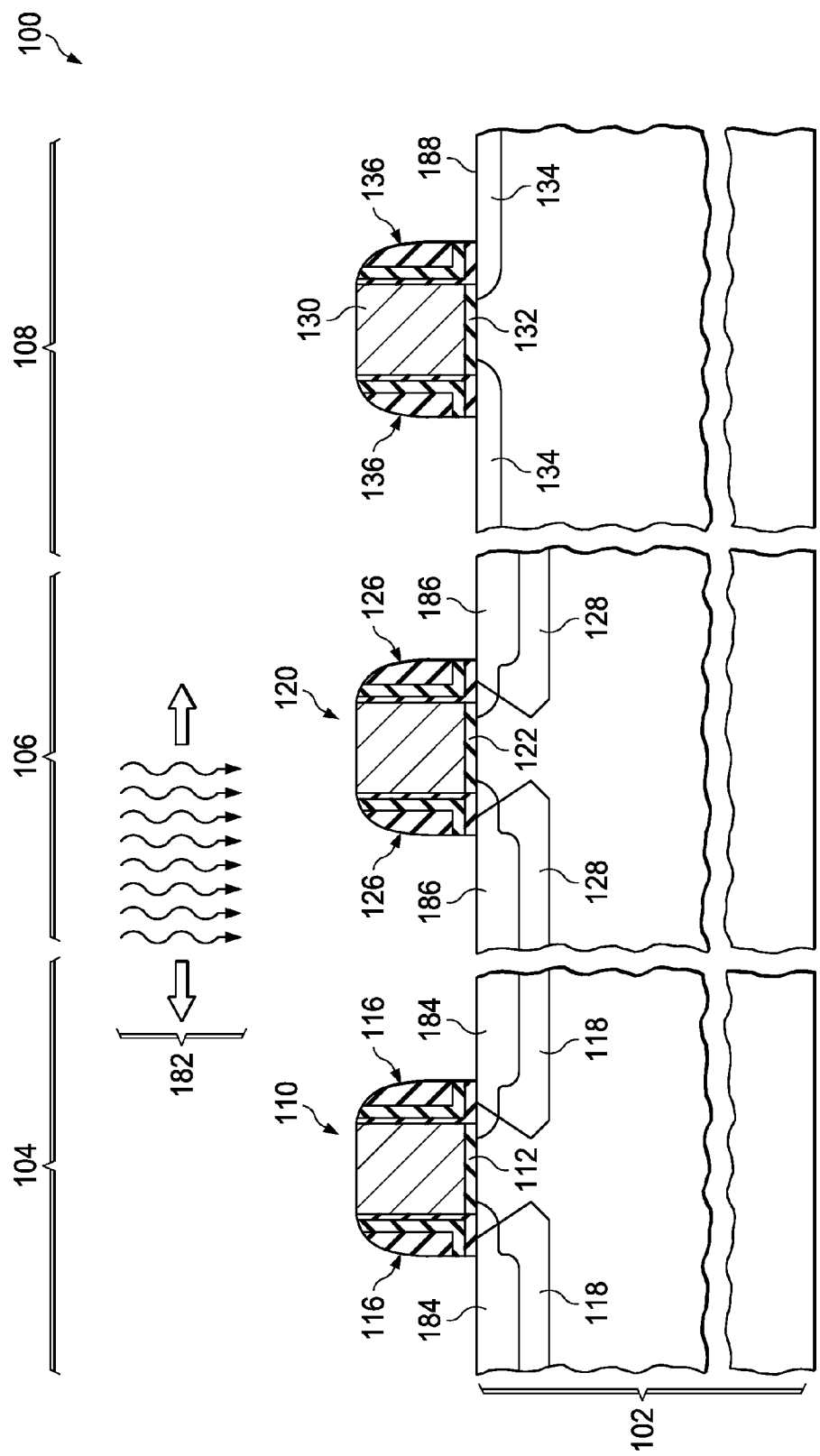

Referring to FIG. 1D, an optional first intermediate laser anneal process 182 recrystallizes the amorphous layers 146 in the logic NMOS transistor 104 and the amorphous layers 150 in the memory NMOS transistor 106, activates the arsenic in the arsenic-doped layers 160 in the logic NMOS transistor 104 and the arsenic-doped layers 160 in the memory NMOS transistor 106, and activates the phosphorus in the phosphorus-doped layers 174 in the logic NMOS transistor 104 and the phosphorus-doped layers 174 in the memory NMOS transistor 106, so as to form source and drain regions 184 in the substrate 102 adjacent to and extending under the gate dielectric layer 112 of the logic NMOS transistor 104 and to form source and drain regions 186 in the substrate 102 adjacent to and extending under the gate dielectric layer 122 of the memory NMOS transistor 106. The first intermediate laser anneal process 182 recrystallizes the gate 110 and activates the arsenic and phosphorus implanted in the gate 110 of the logic NMOS transistor 104, and recrystallizes the gate 120 and activates the arsenic and phosphorus implanted in the gate 120 of the memory NMOS transistor 106. The first intermediate laser anneal process 182 may, for example, have a concentrated beam which is moved across the integrated circuit 100 as depicted schematically in FIG. 1D to heat a top surface 188 of the substrate 102 to 1225° C. to 1275° C. for 100 nanoseconds to 100 microseconds.

Figure 1E:
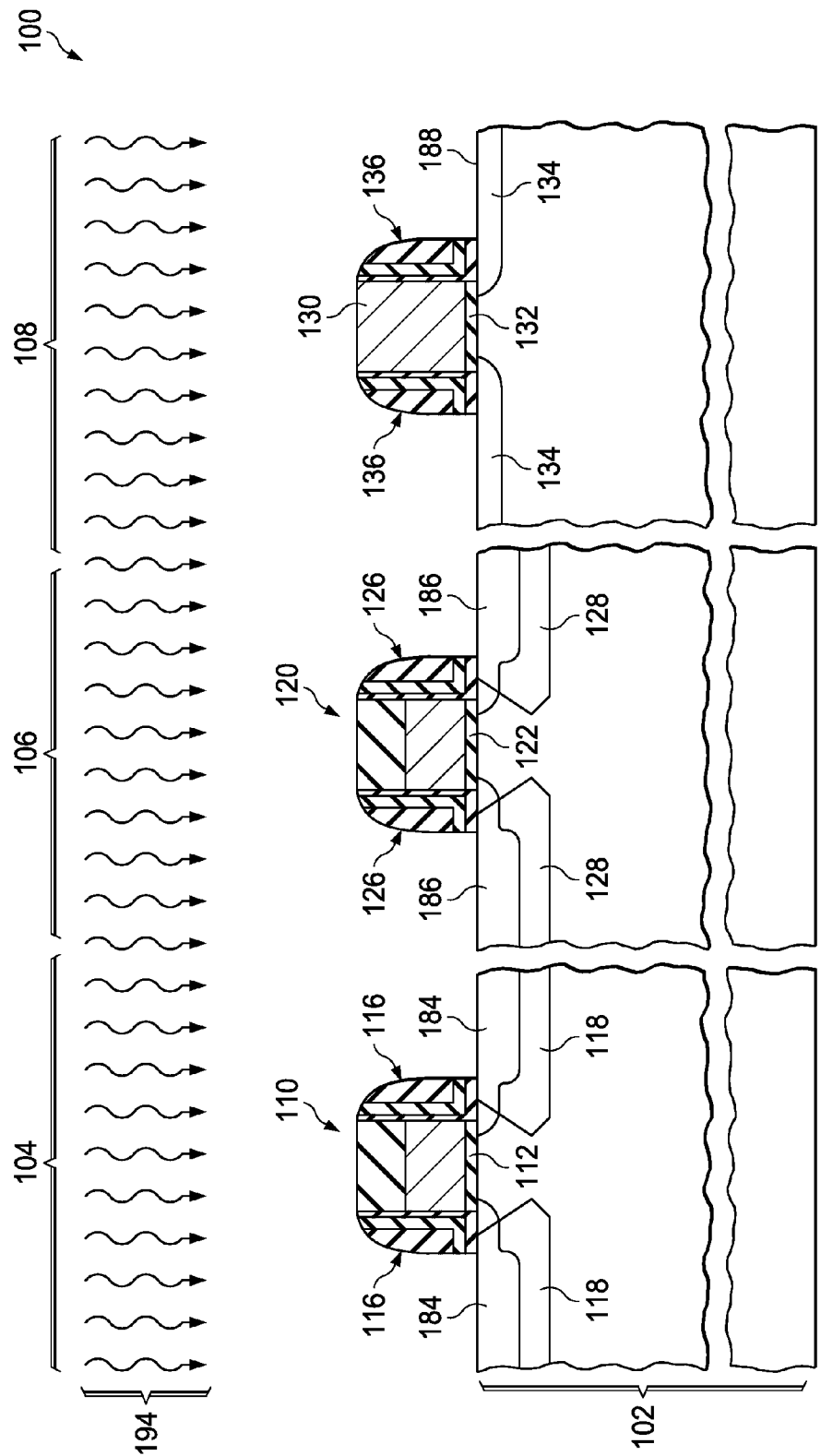

Referring to FIG. 1E, an optional subsequent intermediate spike anneal process 190 further activates the arsenic and the phosphorus in the source and drain regions 184 of the logic NMOS transistor 104 and the source and drain regions 186 of the memory NMOS transistor 106. The intermediate spike anneal process 190 may, for example, heat the substrate 102 to 950° C. to 1050° C. for 100 milliseconds to 2 seconds. In versions of the instant example in which the epitaxial source and drain regions 118 of the logic NMOS transistor 104 and/or the epitaxial source and drain regions 128 of the memory NMOS transistor 106 are present, the intermediate spike anneal process 190 may be advantageously limited to heating the substrate 102 to no more than 1000° C. so as to reduce carbon coming out of substitutional positions and reducing desired the tensile stress. The intermediate spike anneal process 190 may be performed in a rapid thermal processor (RTP).

Figure 1F:
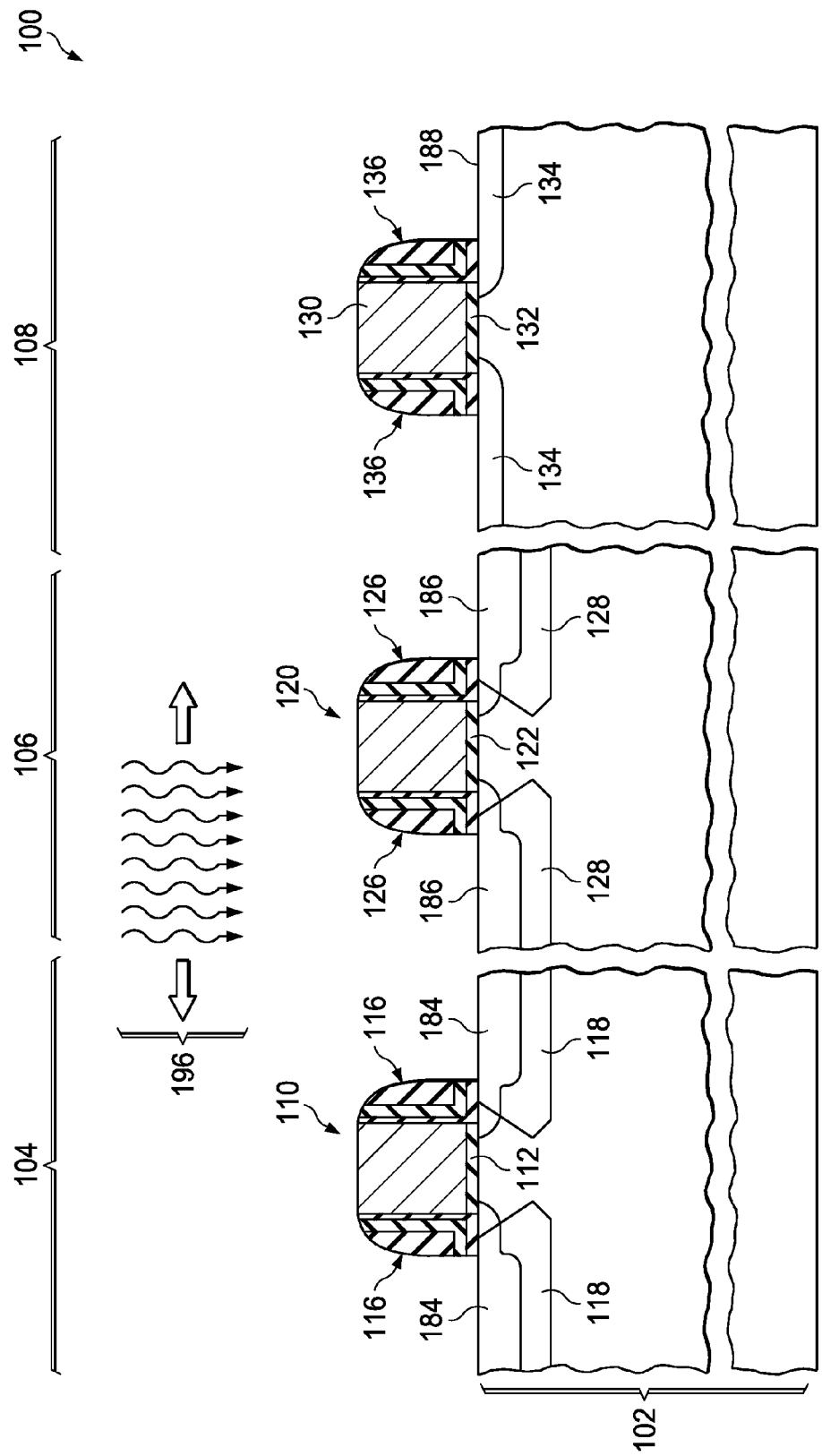

Referring to FIG. 1F, an optional subsequent second intermediate laser anneal process 192 further activates the arsenic and the phosphorus in the source and drain regions 184 of the logic NMOS transistor 104 and the source and drain regions 186 of the memory NMOS transistor 106. The second intermediate laser anneal process 192 may be similar to the first intermediate laser anneal process 182. Performing the first intermediate laser anneal process 182, the subsequent intermediate spike anneal process 190 and the subsequent second intermediate laser anneal process 192 may advantageously reduce crystal defects and provide a higher degree of activation of the arsenic and phosphorus compared to a process sequence having only one laser anneal or only one laser anneal and a spike anneal.

Figure 1G:
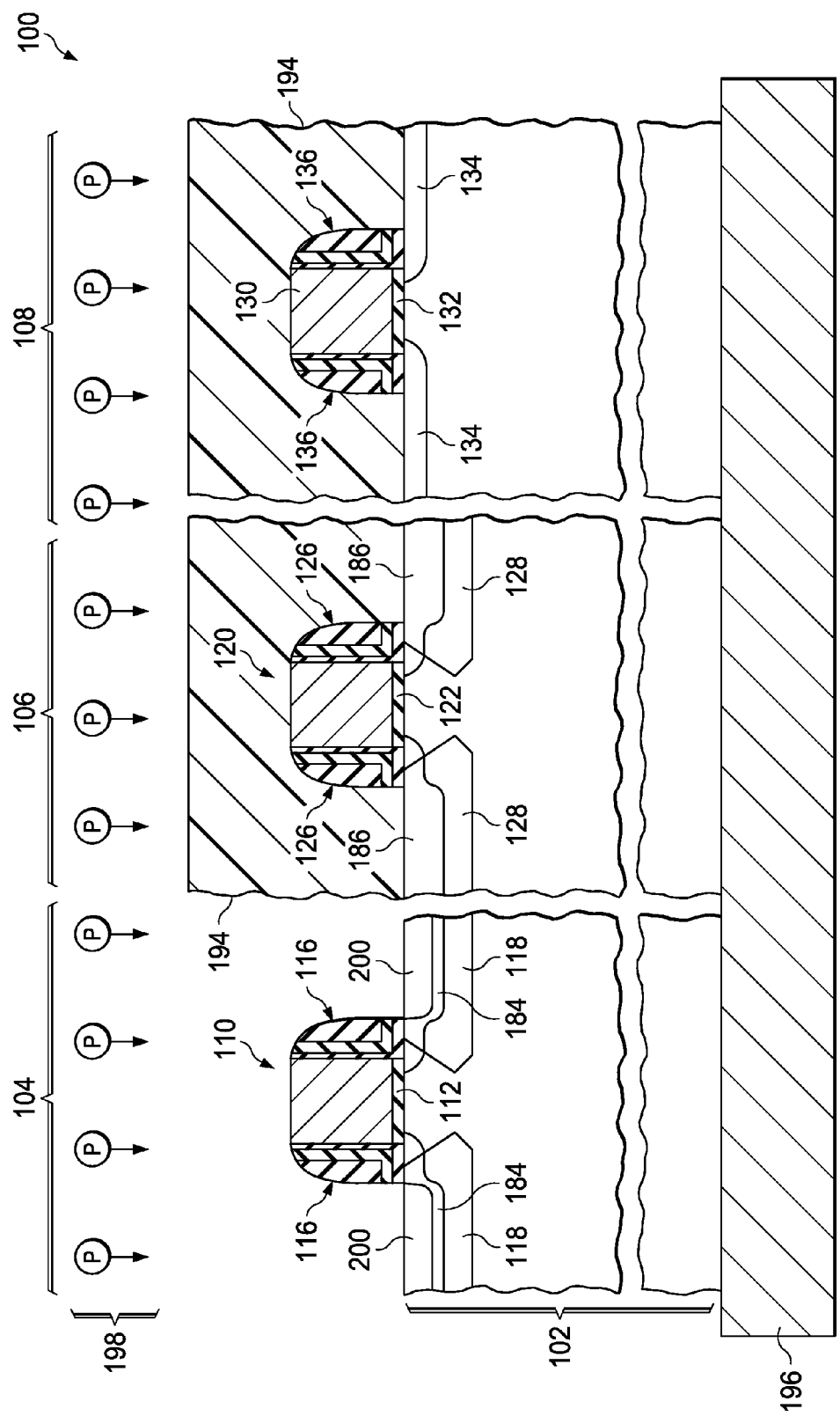

Referring to FIG. 1G, a logic NSD implant mask 194 is formed over the integrated circuit 100 so as to expose the logic NMOS transistor 104 and cover the memory NMOS transistor 106 and the PMOS transistor 108. The logic NSD implant mask 194 may include, for example, photoresist and possibly an antireflection layer, and may be formed similarly to the common NSD implant mask 138 of FIG. 1A. The integrated circuit 100 is disposed on a first non-cryogenic substrate holder 196, which is at a non-cryogenic temperature above −25° C. (248° K). In one version of the instant example, the first non-cryogenic substrate holder 196 may be cooled with chilled water to a non-cryogenic temperature of 0° C. (273° K) to 20° C. (293° K). It will be recognized that the first non-cryogenic substrate holder 196 may be one of the cryogenic substrate holders 140, 154 and/or 168, which is not cooled for the instant step.

While the integrated circuit 100 is disposed on the first non-cryogenic substrate holder 196, phosphorus 198 is implanted into the logic NMOS transistor 104, while the logic NSD implant mask 194 blocks the phosphorus 198 from the memory NMOS transistor 106 and the PMOS transistor 108. Implantation of the phosphorus 198 forms phosphorus-doped layers 200 in the substrate 102 adjacent to the gate sidewall spacers 116 of the logic NMOS transistor 104, overlapping the source and drain regions 184 of the logic NMOS transistor 104. A dose range and an energy range of the phosphorus 198 is 10 percent to 50 percent of the dose of the phosphorus 172 implanted at cryogenic temperature, at 1 keV to 5 keV.

Figure 1H:
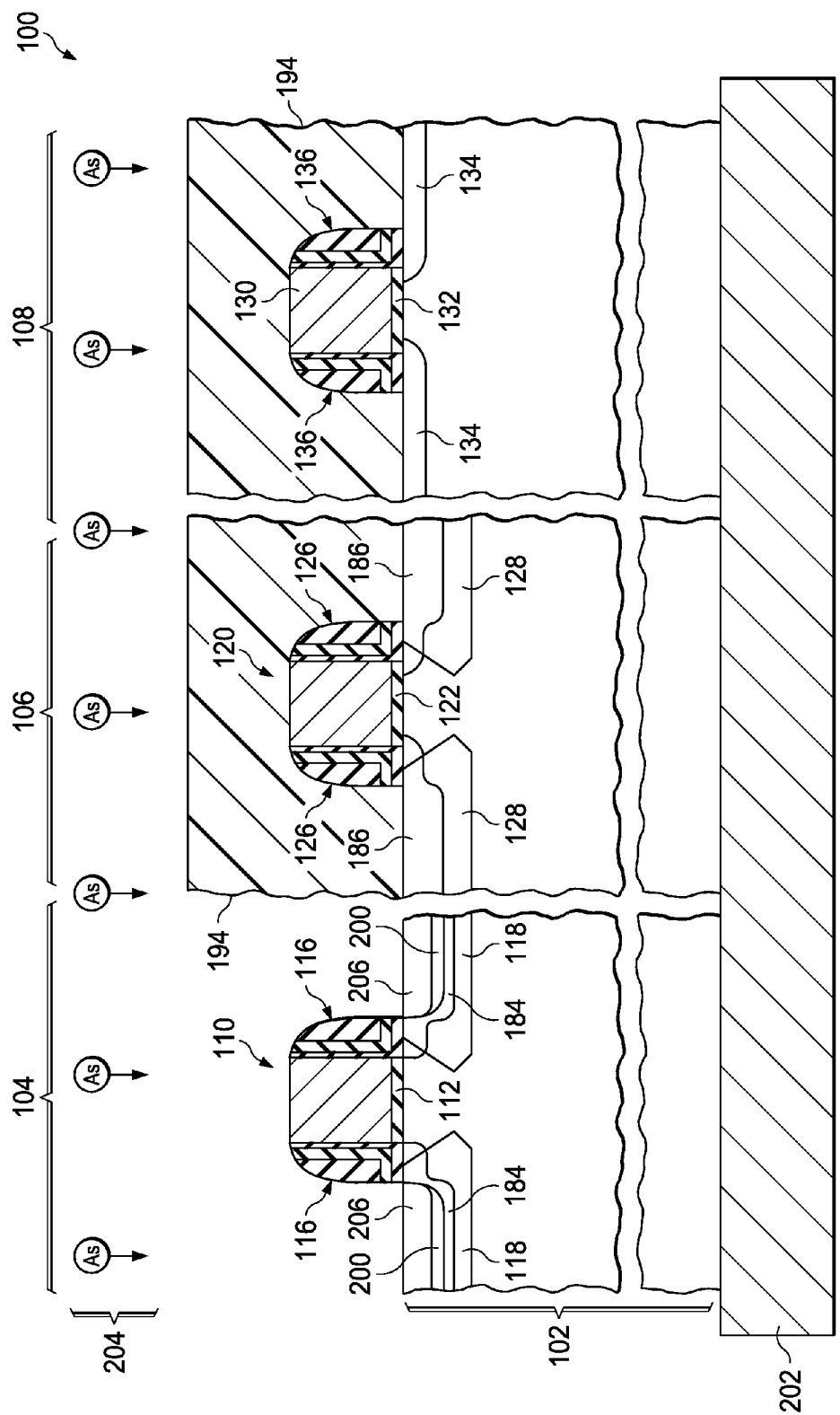

Referring to FIG. 1H, the integrated circuit 100 may be disposed on a second non-cryogenic substrate holder 202, and while the logic NSD implant mask 194 is in place, arsenic 204 may optionally be implanted into the logic NMOS transistor 104, while the logic NSD implant mask 194 blocks the arsenic 204 from the memory NMOS transistor 106 and the PMOS transistor 108. Implantation of the arsenic 204 forms arsenic-doped layers 206 in the substrate 102 adjacent to the gate sidewall spacers 116 of the logic NMOS transistor 104, overlapping the source and drain regions 184 of the logic NMOS transistor 104. A dose range and an energy range of the arsenic 204 is 10 percent to 30 percent of the dose of the arsenic 158 implanted at cryogenic temperature, at, for example, 10 keV to 20 keV. It will be recognized that the second non-cryogenic substrate holder 202 used for implanting the arsenic 204 may be the first non-cryogenic substrate holder 196 used for implanting the phosphorus 198. The logic NSD implant mask 194 is subsequently removed, for example as described with respect to the common NSD implant mask 138 in reference to FIG. 1C.

Figure 1I:
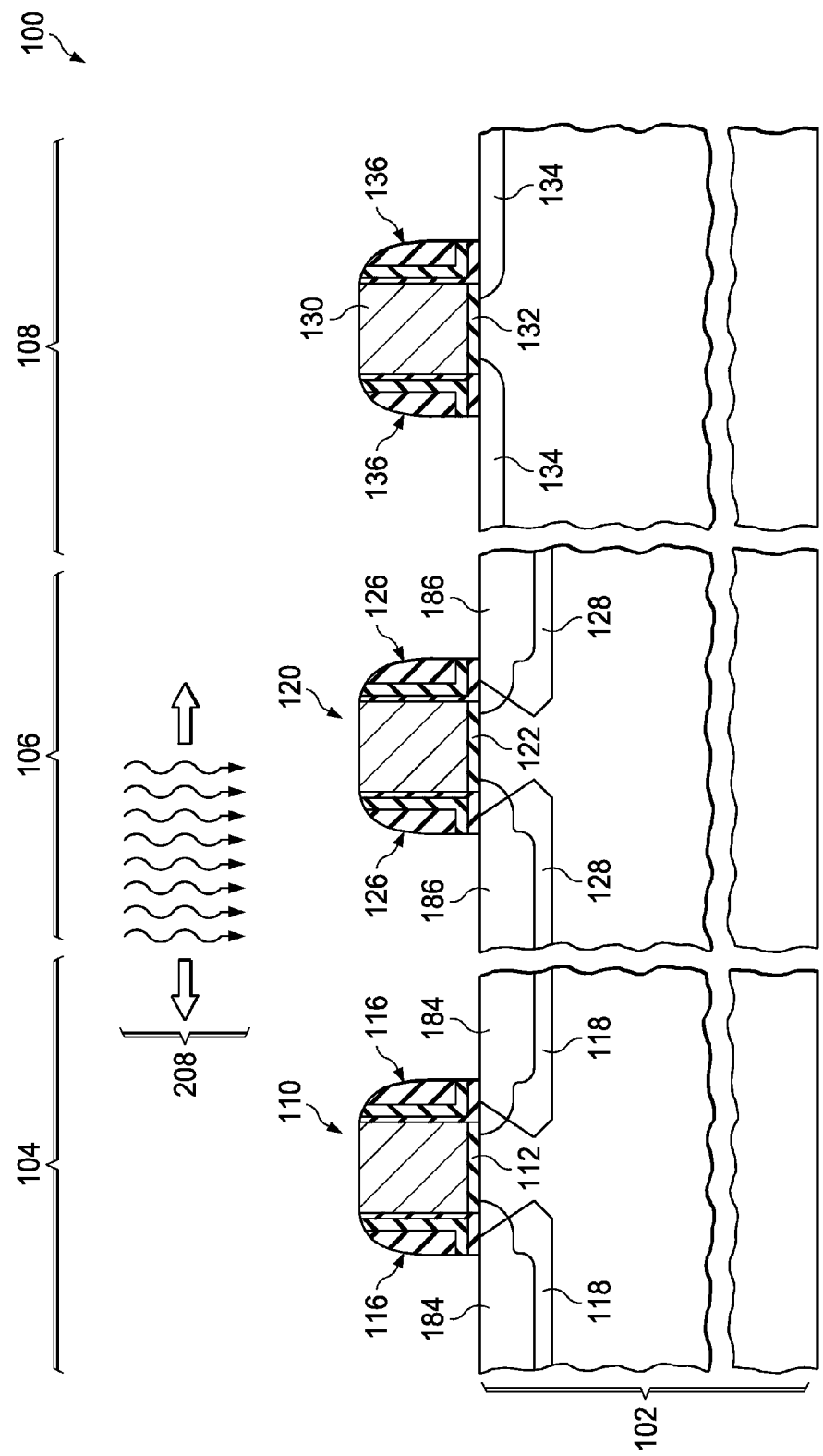

Referring to FIG. 1I, a first final laser anneal process 208 activates the phosphorus in the phosphorus-doped layers 200, and activates the arsenic in the arsenic-doped layers 206, if present, to increase a total activated dopant amount in the source and drain regions 184 of the logic NMOS transistor 104. The first final laser anneal process 208 may be similar to the first intermediate laser anneal process 182 described in reference to FIG. 1D.

Figure 1J:
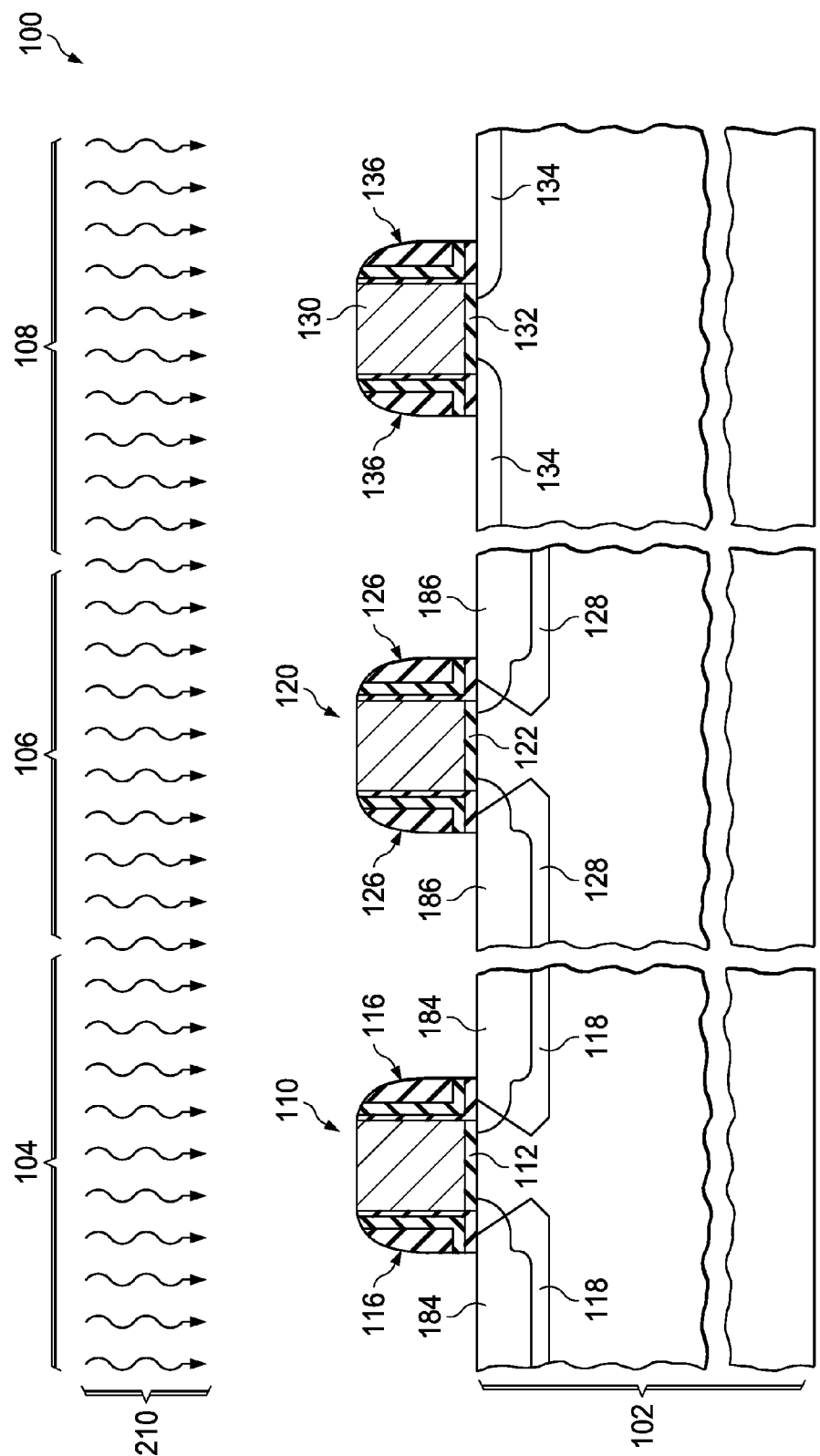

Referring to FIG. 1J, an optional subsequent final spike anneal process 210 further activates the phosphorus and arsenic in the source and drain regions 184 of the logic NMOS transistor 104. The final spike anneal process 210 may be similar to the intermediate spike anneal process 190 described in reference to FIG. 1E.

Figure 1K:
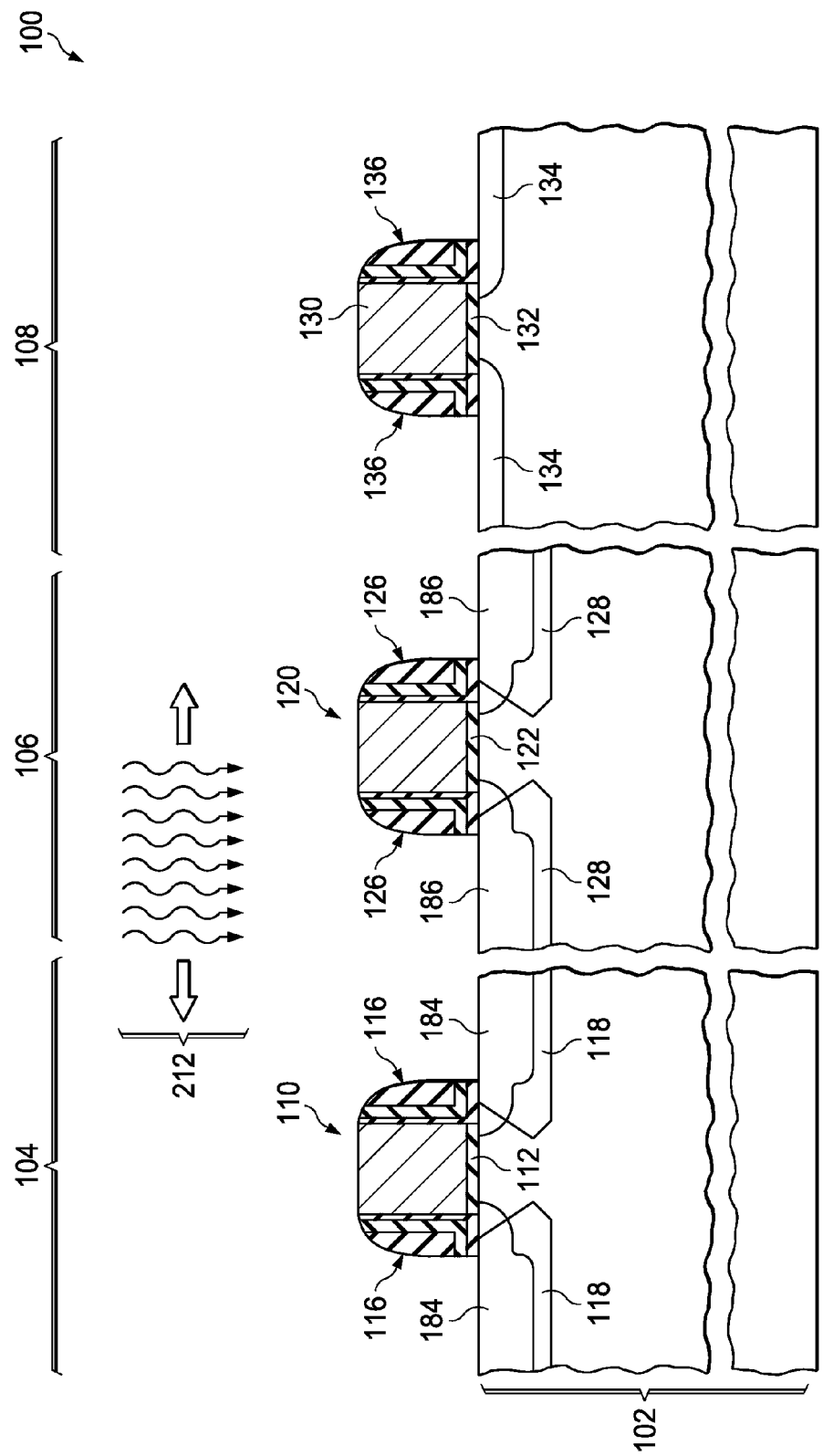

Referring to FIG. 1K, an optional subsequent second final laser anneal process 212 further activates the phosphorus and the arsenic in the source and drain regions 184 of the logic NMOS transistor 104. The second final laser anneal process 212 may be similar to the first final laser anneal process 208. Performing the first final laser anneal process 208, the subsequent final spike anneal process 210 and the subsequent second final laser anneal process 212 may advantageously reduce crystal defects and provide a higher degree of activation of the arsenic and phosphorus compared to a process sequence having only one laser anneal or only a laser anneal and a spike anneal.

Figure 3:
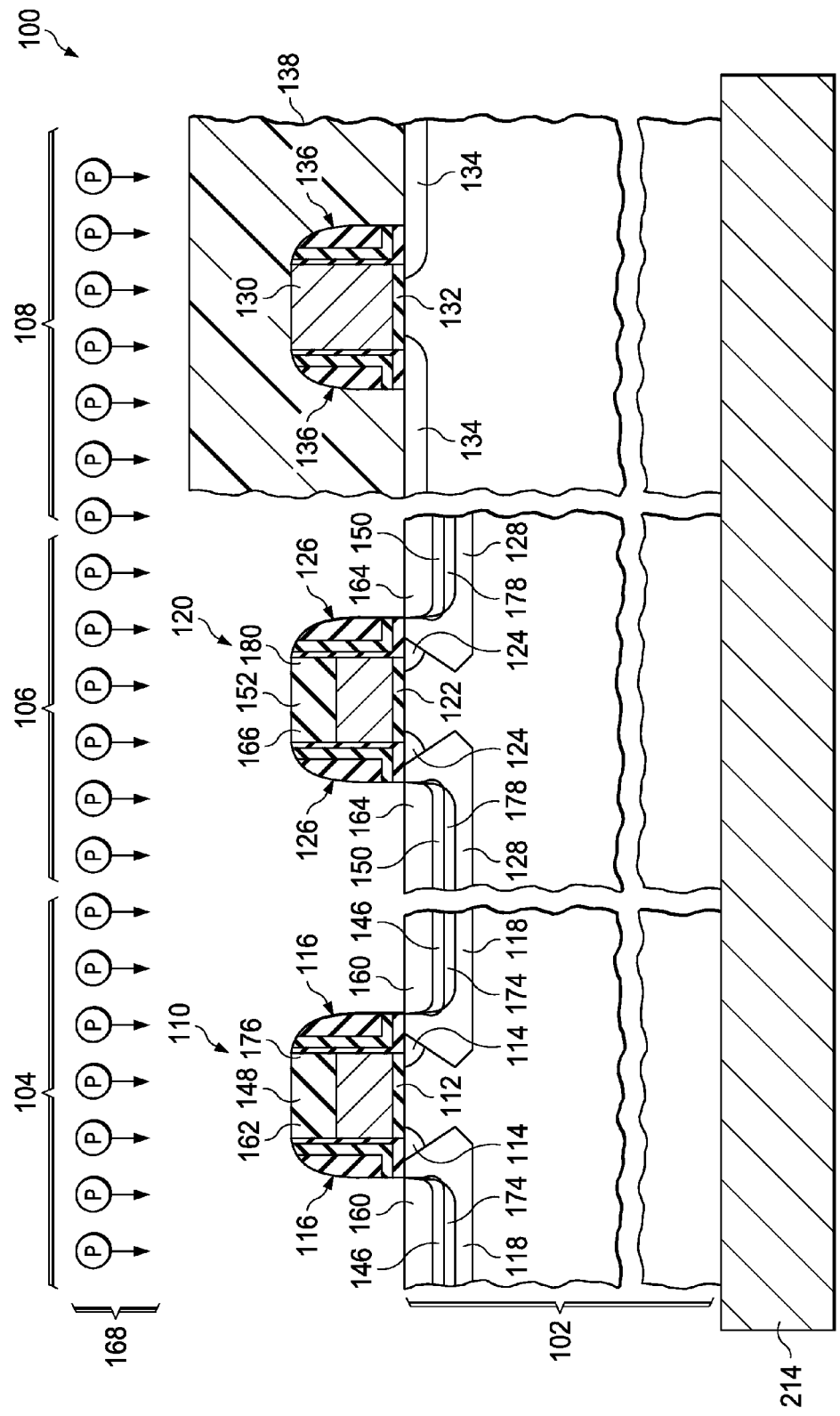
FIG. 3 depicts the integrated circuit in such an alternate process sequence at the common phosphorus implant step described in reference to FIG. 1C.

The integrated circuit 100 may be formed by an alternate process sequence, in which the common phosphorus 172 implant step described in reference to FIG. 1C is performed using a third non-cryogenic substrate holder 214. FIG. 3 depicts the integrated circuit 100 in such an alternate process sequence at the common phosphorus implant step described in reference to FIG. 1C. The phosphorus 172 is implanted into the logic NMOS transistor 104 and the memory NMOS transistor 106, while the common NSD implant mask 138 blocks the phosphorus 172 from the PMOS transistor 108. In the instant example, the phosphorus 172 is implanted while the substrate 102 is disposed on the third non-cryogenic substrate holder 214. It will be recognized that the third non-cryogenic substrate holder 214 used for implanting the phosphorus 172 may be the first non-cryogenic substrate holder 196 and/or the second non-cryogenic substrate holder 202 used for implanting the phosphorus 198 and the arsenic 204, respectively, described in reference to FIG. 1G and FIG. 1H. Implantation of the phosphorus 172 forms the phosphorus-doped layers 174 in the substrate 102 adjacent to the gate sidewall spacers 116 of the logic NMOS transistor 104 as described in reference to FIG. 1C. Implanting the phosphorus 172 using the third non-cryogenic substrate holder 214 may advantageously reduce a fabrication cost of the integrated circuit 100.

Figure 4A:
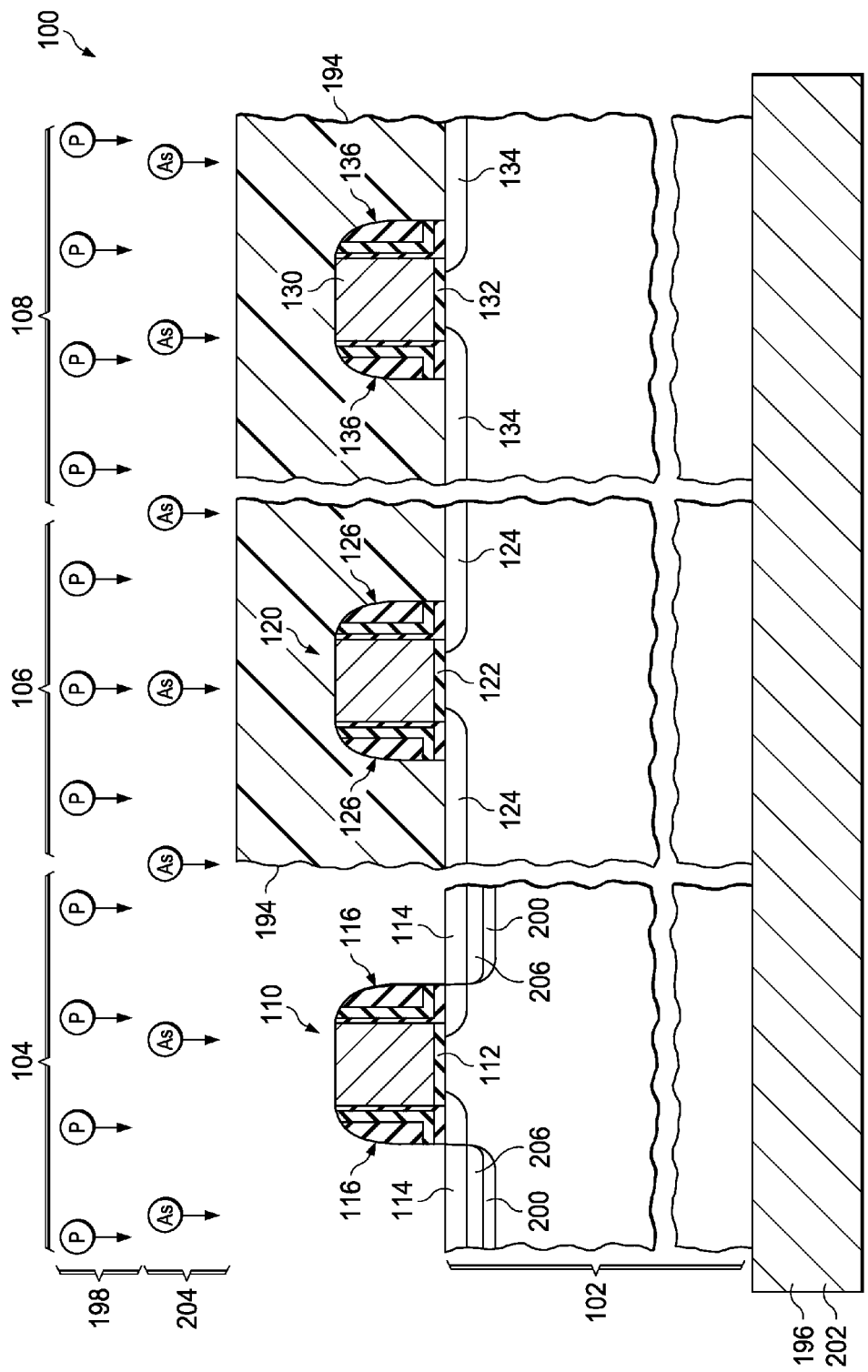
FIG. 4A through FIG. 4D are cross sections of the integrated circuit formed according to an alternate process sequence, in which the non-cryogenic implants precede the cryogenic implants, depicted in successive stages of fabrication.

FIG. 4A through FIG. 4D are cross sections of the integrated circuit 100 formed according to an alternate process sequence, in which the non-cryogenic implants precede the cryogenic implants, depicted in successive stages of fabrication. Referring to FIG. 4A, the logic NSD implant mask 194 is formed over the integrated circuit 100 so as to expose the logic NMOS transistor 104 and cover the memory NMOS transistor 106 and the PMOS transistor 108. The integrated circuit 100 is disposed on the first non-cryogenic substrate holder 196, which is at a non-cryogenic temperature above −25° C. (248° K). In the instant example, the optional epitaxial source and drain regions 118 of the logic NMOS transistor 104 and the optional epitaxial source and drain regions 128 of the memory NMOS transistor 106 are omitted.

The phosphorus 198 is implanted into the logic NMOS transistor 104, while the logic NSD implant mask 194 blocks the phosphorus 198 from the memory NMOS transistor 106 and the PMOS transistor 108. Implantation of the phosphorus 198 forms the phosphorus-doped layers 200, described in reference to FIG. 1G, in the substrate 102 adjacent to the gate sidewall spacers 116 of the logic NMOS transistor 104. A dose range of the phosphorus 198 is 10 percent to 50 percent of the dose of the yet-to-be implanted phosphorus 172 which will be implanted at cryogenic temperature. An energy range of the phosphorus 198 is 1 keV to 5 keV.

The integrated circuit 100 may be disposed on the second non-cryogenic substrate holder 202, which is at a non-cryogenic temperature, and arsenic 204 may optionally be implanted into the logic NMOS transistor 104, while the logic NSD implant mask 194 blocks the arsenic 204 from the memory NMOS transistor 106 and the PMOS transistor 108. Implantation of the arsenic 204 forms the arsenic-doped layers 206, described in reference to FIG. 1H, in the substrate 102 adjacent to the gate sidewall spacers 116 of the logic NMOS transistor 104. A dose range of the arsenic 204 is 10 percent to 30 percent of the dose of the yet-to-be implanted arsenic 158, which will be implanted at cryogenic temperature. An energy range of the arsenic 204 may be, for example, 10 keV to 20 keV. The logic NSD implant mask 194 is subsequently removed, for example as described with respect to the common NSD implant mask 138 in reference to FIG. 1C.

Figure 4B:
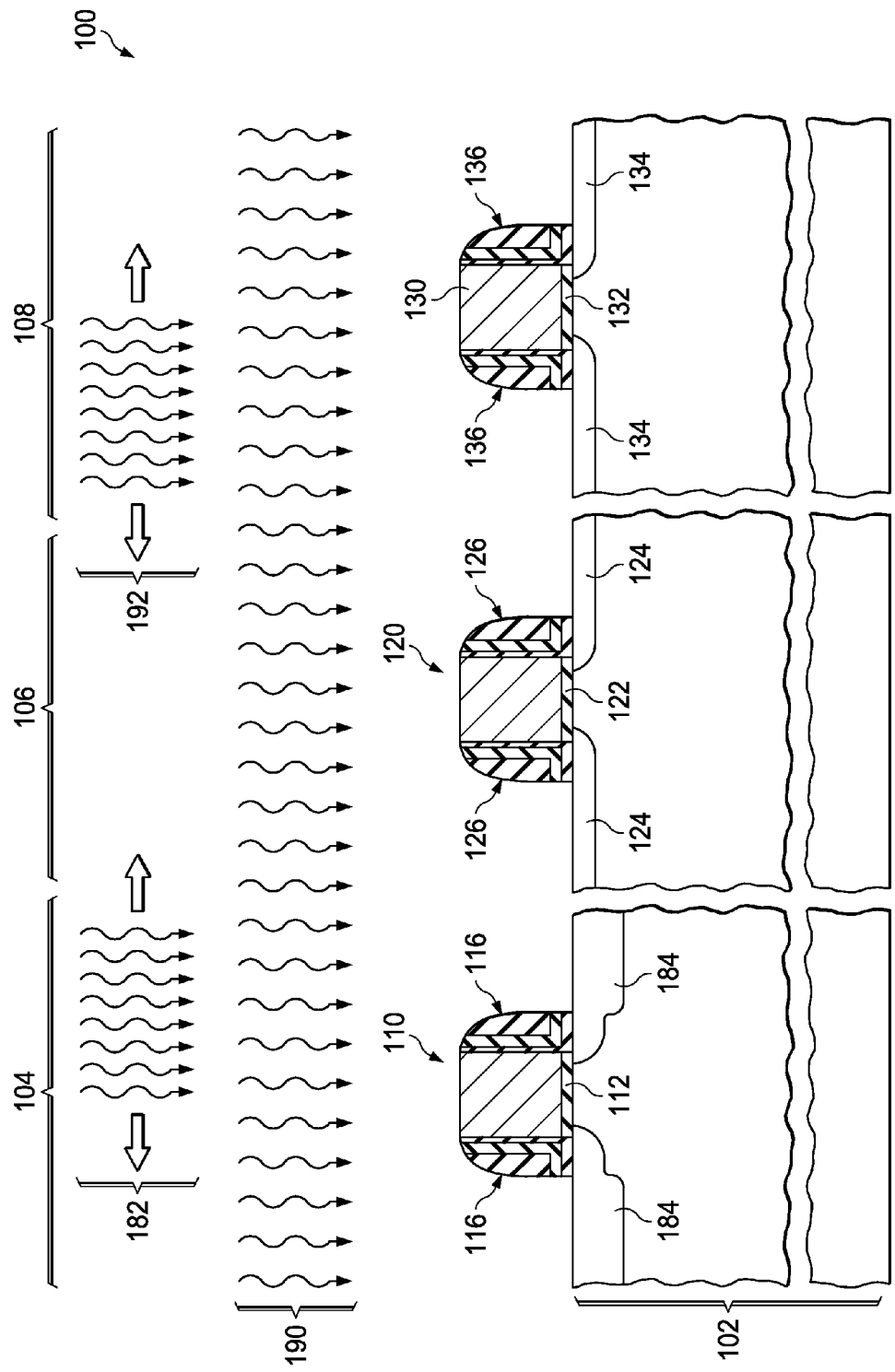

Referring to FIG. 4B, an optional first intermediate laser anneal process 182 activates the phosphorus in the phosphorus-doped layers 200, and activates the arsenic in the arsenic-doped layers 206, if present, to form the source and drain regions 184 in the substrate 102 adjacent to and extending under the gate dielectric layer 112 of the logic NMOS transistor 104. An optional subsequent intermediate spike anneal process 190 further activates the arsenic and the phosphorus in the source and drain regions 184 of the logic NMOS transistor 104. An optional subsequent second intermediate laser anneal process 192 further activates the arsenic and the phosphorus in the source and drain regions 184 of the logic NMOS transistor 104. Performing the first intermediate laser anneal process 182, the subsequent intermediate spike anneal process 190 and the subsequent second intermediate laser anneal process 192 may advantageously reduce crystal defects and provide a higher degree of activation of the arsenic and phosphorus compared to a process sequence having only one laser anneal or only one laser anneal and a spike anneal.

Figure 4C:
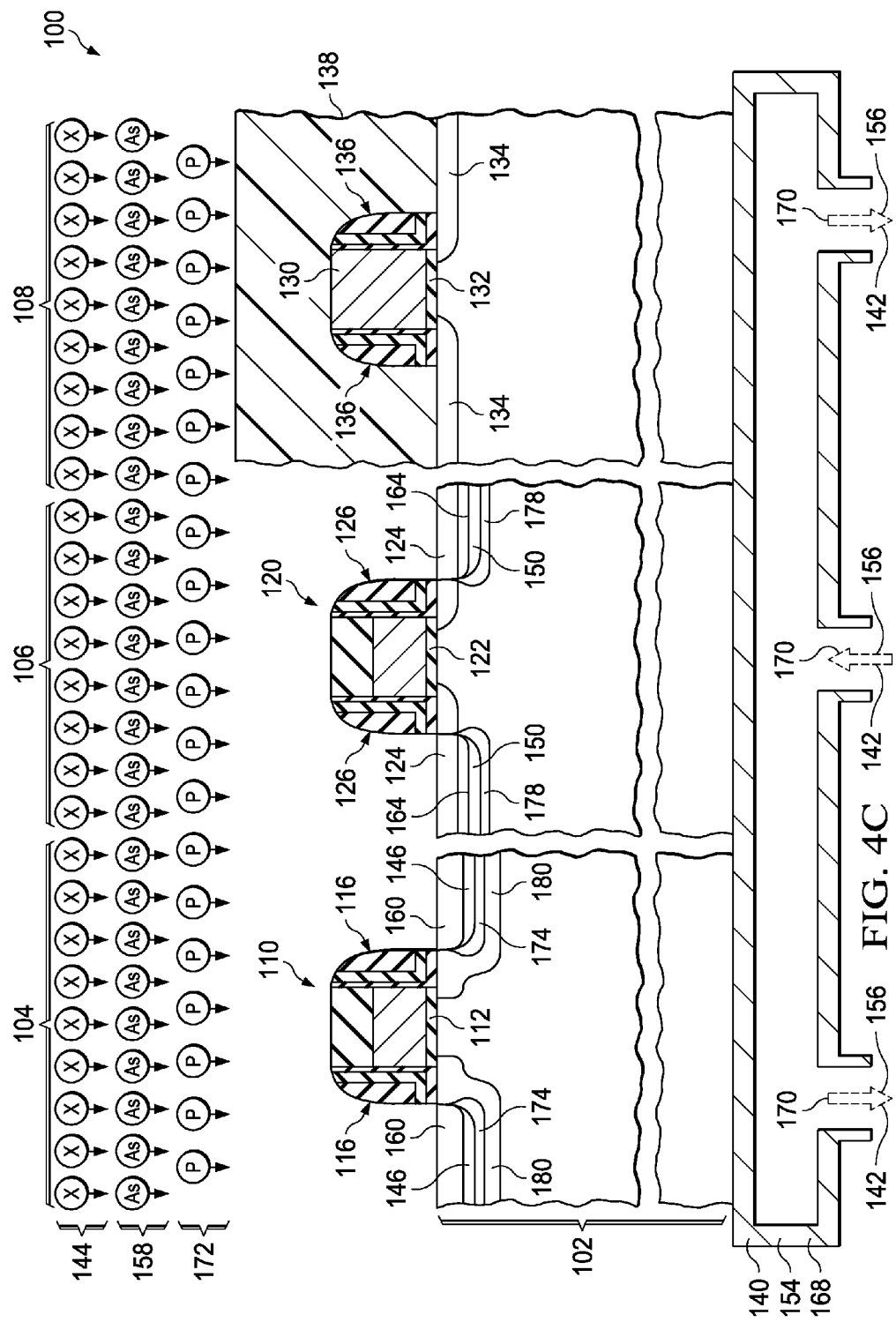

Referring to FIG. 4C, the common NSD implant mask 138 is formed over the integrated circuit 100 so as to expose the logic NMOS transistor 104 and the memory NMOS transistor 106, and cover the PMOS transistor 108. The integrated circuit 100 is disposed on the first cryogenic substrate holder 140, which cools the substrate 102 as described in reference to FIG. 1A and FIG. 1B. The amorphizing species 144 is implanted into the logic NMOS transistor 104 and the memory NMOS transistor 106, while the common NSD implant mask 138 blocks the amorphizing species 144 from the PMOS transistor 108. Implantation of the amorphizing species 144 forms the amorphous layers 146 in the substrate 102 adjacent to the gate sidewall spacers 116 of the logic NMOS transistor 104. Similarly, implantation of the amorphizing species 144 forms amorphous layers 150 in the substrate 102 adjacent to the gate sidewall spacers 126 of the memory NMOS transistor 106. An exemplary dose range and energy range for the amorphizing species 144 may be $1\times10^{14}$ cm$^{-2}$ to $2\times10^{15}$ cm$^{-2}$ at 10 keV to 20 keV.

The integrated circuit 100 is disposed on the second cryogenic substrate holder 154, which cools the substrate 102 as described in reference to FIG. 1A and FIG. 1B. The arsenic 158 is implanted into the logic NMOS transistor 104 and the memory NMOS transistor 106, while the common NSD implant mask 138 blocks the arsenic 158 from the PMOS transistor 108. Implantation of the arsenic 158 forms the arsenic-doped layers 160 in the substrate 102 adjacent to the gate sidewall spacers 116 of the logic NMOS transistor 104. Similarly, implantation of the arsenic 158 forms the arsenic-doped layers 164 in the substrate 102 adjacent to the gate sidewall spacers 126 of the memory NMOS transistor 106. An exemplary dose range and energy range for the arsenic 158 may be $5\times10^{14}$ cm$^{-2}$ to $1\times10^{16}$ cm$^{-2}$ at 10 keV to 20 keV.

The phosphorus 172 is implanted into the logic NMOS transistor 104 and the memory NMOS transistor 106, while the common NSD implant mask 138 blocks the phosphorus 172 from the PMOS transistor 108. In the instant example, the phosphorus 172 is implanted while the substrate 102 is cooled by the third cryogenic substrate holder 168. Implantation of the phosphorus 172 forms phosphorus-doped layers 174 in the substrate 102 adjacent to the gate sidewall spacers 116 of the logic NMOS transistor 104. Similarly, implantation of the phosphorus 172 forms phosphorus-doped layers 178 in the substrate 102 adjacent to the gate sidewall spacers 126 of the memory NMOS transistor 106. An exemplary dose range and energy range for the phosphorus 172 may be $5\times10^{14}$ cm$^{-2}$ to $1\times10^{16}$ cm$^{-2}$ at 1 keV to 5 keV. Implanting the phosphorus 172 using the third cryogenic substrate holder 168 may accrue similar benefits as described for implanting the amorphizing species 144 and the arsenic 158 while cooling the substrate 102. The common NSD implant mask 138 is subsequently removed, for example as described in reference to FIG. 1C.

Figure 4D:
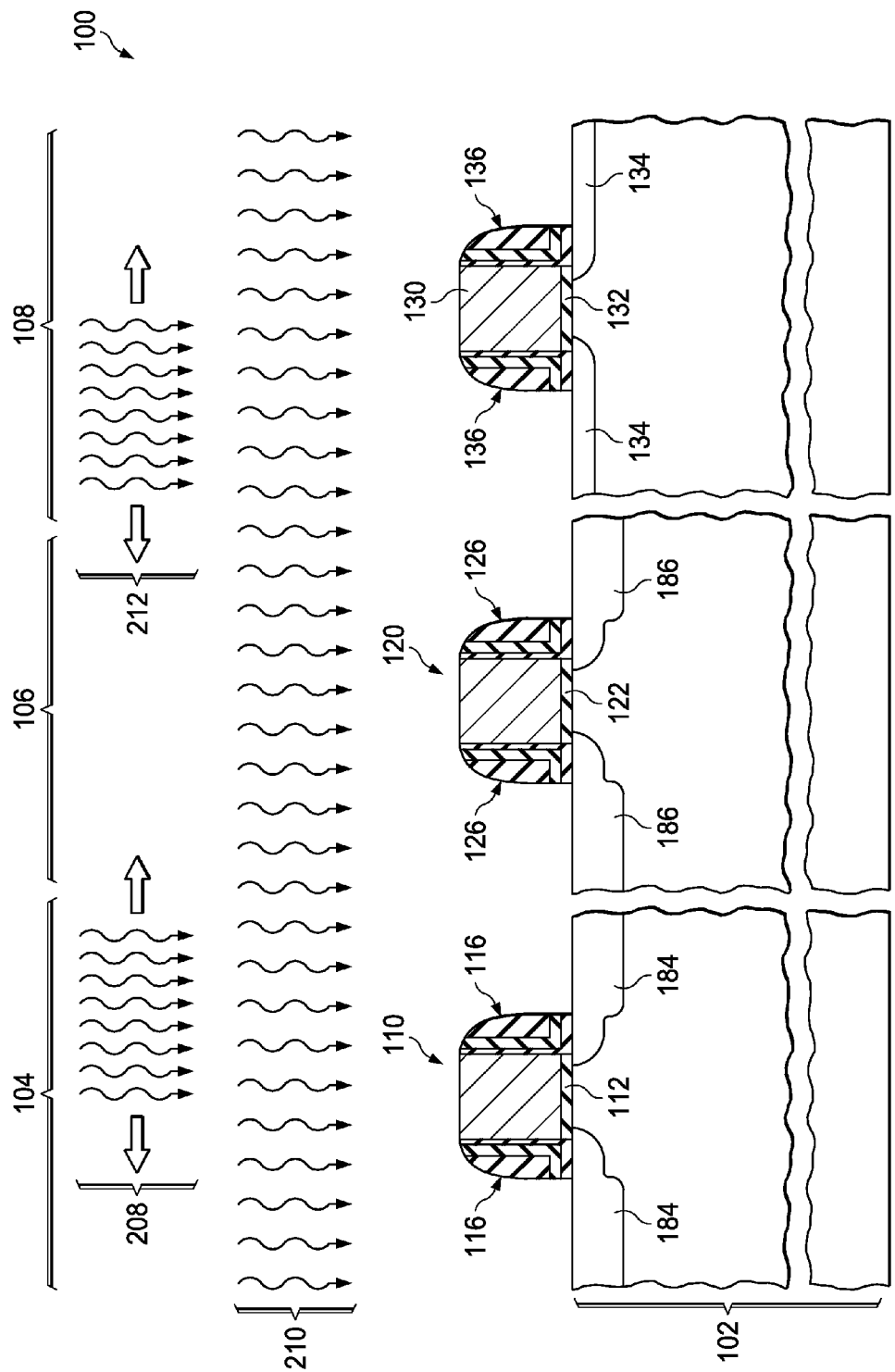

Referring to FIG. 4D, the first final laser anneal process 208 recrystallizes the amorphous layers 146 in the logic NMOS transistor 104 and the amorphous layers 150 in the memory NMOS transistor 106, activates the arsenic in the arsenic-doped layers 160 in the logic NMOS transistor 104 and the arsenic-doped layers 160 in the memory NMOS transistor 106, and activates the phosphorus in the phosphorus-doped layers 174 in the logic NMOS transistor 104 and the phosphorus-doped layers 174 in the memory NMOS transistor 106, so as to increase a total activated dopant amount in the source and drain regions 184 of the logic NMOS transistor 104 and to form source and drain regions 186 in the substrate 102 adjacent to and extending under the gate dielectric layer 122 of the memory NMOS transistor 106. The first final laser anneal process 208 may be similar to the first intermediate laser anneal process 182 described in reference to FIG. 1D.

The optional subsequent final spike anneal process 210 further activates the phosphorus and arsenic in the source and drain regions 184 of the logic NMOS transistor 104 and the source and drain regions 186 of the memory NMOS transistor 106. The final spike anneal process 210 may be similar to the intermediate spike anneal process 190 described in reference to FIG. 1E. The optional subsequent second final laser anneal process 212 further activates the phosphorus and the arsenic in the source and drain regions 184 of the logic NMOS transistor 104 and the source and drain regions 186 of the memory NMOS transistor 106. The second final laser anneal process 212 may be similar to the first final laser anneal process 208. Performing the first final laser anneal process 208, the subsequent final spike anneal process 210 and the subsequent second final laser anneal process 212 may advantageously reduce crystal defects and provide a higher degree of activation of the arsenic and phosphorus compared to a process sequence having only one laser anneal or only a laser anneal and a spike anneal.

Figure 5:
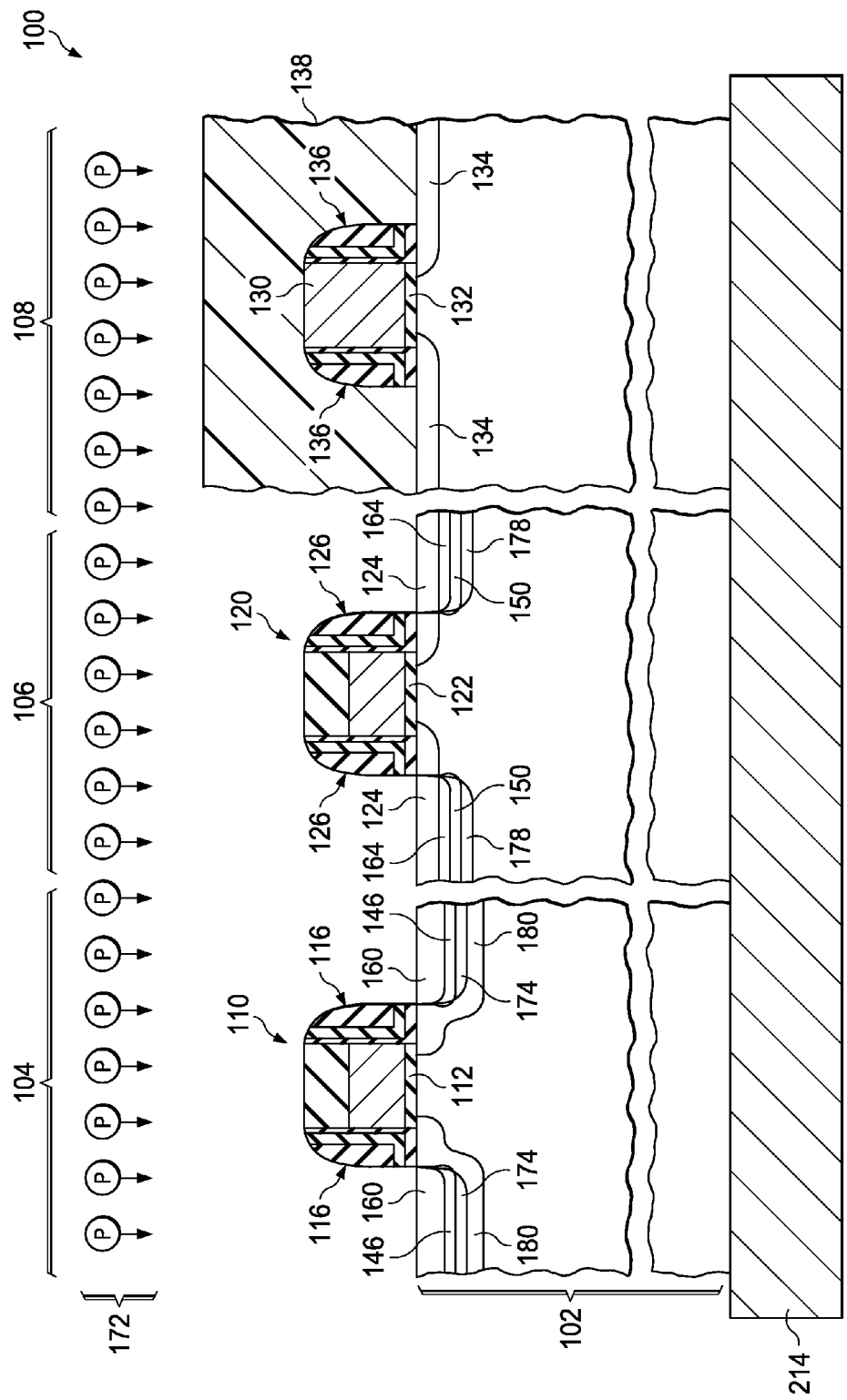
FIG. 5 depicts the integrated circuit in such an alternate process sequence at the common phosphorus implant step described in reference to FIG. 4C.

The integrated circuit 100 may be formed by an alternate process sequence, in which the common phosphorus implant step described in reference to FIG. 4C is performed using a non-cryogenic substrate holder. FIG. 5 depicts the integrated circuit 100 in such an alternate process sequence at the common phosphorus implant step described in reference to FIG. 4C. The phosphorus 172 is implanted into the logic NMOS transistor 104 and the memory NMOS transistor 106, while the common NSD implant mask 138 blocks the phosphorus 172 from the PMOS transistor 108. In the instant example, the phosphorus 172 is implanted while the substrate 102 is disposed on the third non-cryogenic substrate holder 214. Implantation of the phosphorus 172 forms the phosphorus-doped layers 174 in the substrate 102 adjacent to the gate sidewall spacers 116 of the logic NMOS transistor 104 and forms the phosphorus-doped layers 178 in the substrate 102 adjacent to the gate sidewall spacers 126 of the memory NMOS transistor 106, as described in reference to FIG. 4C. Implanting the phosphorus 172 using the third non-cryogenic substrate holder 214 may advantageously reduce a fabrication cost of the integrated circuit 100.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising the steps of:
   forming a common n-channel source/drain (NSD) implant mask so as to expose an area for a logic n-channel metal oxide semiconductor (NMOS) transistor and an area for a memory NMOS transistor, and cover an area for a p-channel metal oxide semiconductor (PMOS) transistor;
   subsequently disposing said substrate on a first cryogenic substrate holder, which is cooled to a first cryogenic temperature no warmer than a first maximum effective cryogenic temperature $T_{max1}$;
   subsequently implanting an amorphizing species at a first implant beam current density $J_{beam1}$ so as to form amorphous layers in said substrate adjacent to gate sidewall spacers of said logic NMOS transistor and form amorphous layers in said substrate adjacent to gate sidewall spacers of said memory NMOS transistor, said first maximum effective cryogenic temperature $T_{max1}$ being determined by said first implant beam current density $J_{beam1}$ according to the relationship:

$$\log(J_{beam1}) = -(1020/(T_{max1}+273))+4.898;$$

subsequently disposing said substrate on a second cryogenic substrate holder, which is cooled to a second cryogenic temperature no warmer than a second maximum effective cryogenic temperature $T_{max2}$;

subsequently implanting arsenic at a second implant beam current density $J_{beam2}$ so as to form arsenic-doped layers in said substrate adjacent to said gate sidewall spacers of said logic NMOS transistor and form arsenic-doped layers in said substrate adjacent to said gate sidewall spacers of said memory NMOS transistor, said second maximum effective cryogenic temperature $T_{max2}$ being determined by said second implant beam current density $J_{beam2}$ according to the relationship:

$$\log(J_{beam2}) = -(1020/(T_{max2}+273))+4.898;$$

implanting phosphorus while said common NSD implant mask is in place so as to form phosphorus-doped layers in said substrate adjacent to said gate sidewall spacers of said logic NMOS transistor and form phosphorus-doped layers in said substrate adjacent to said gate sidewall spacers of said memory NMOS transistor;

forming a logic NSD implant mask over said substrate so as to expose said area for said logic NMOS transistor and cover said area for said memory NMOS transistor and said area for said PMOS transistor;

subsequently disposing said substrate on a first non-cryogenic substrate holder, which is at a non-cryogenic temperature above −25° C. (248° K);

implanting phosphorus while said logic NSD implant mask is in place so as to form phosphorus-doped layers in said substrate adjacent to said gate sidewall spacers of said logic NMOS transistor.

2. The method of claim 1, further comprising the step of performing an intermediate laser anneal after said steps of implanting arsenic and implanting phosphorus with said common NSD implant mask in place and before said step of forming said logic NSD implant mask.

3. The method of claim 1, further comprising the step of performing an intermediate laser anneal after said steps of implanting phosphorus with said logic NSD implant mask in place and before said step of forming said common NSD implant mask.

4. The method of claim 1, in which said second cryogenic substrate holder is said first cryogenic substrate holder.

5. The method of claim 1, in which said step of implanting phosphorus while said common NSD implant mask is in place is performed while said integrated circuit is disposed on a third cryogenic substrate holder which is cooled to a cryogenic temperature below −25° C. (248° K).

6. The method of claim 1, in which said phosphorus which is implanted while said logic NSD implant mask is in place has a dose of 10 percent to 50 percent of a dose of said phosphorus which is implanted while said common NSD implant mask is in place.

7. The method of claim 1, in which said phosphorus which is implanted while said common NSD implant mask is in place has a dose of $5 \times 10^{14}$ cm$^{-2}$ to $1 \times 10^{16}$ cm$^{-2}$.

8. The method of claim 1, further comprising the step of performing a first final laser anneal after said steps of implanting arsenic and implanting phosphorus with said common NSD implant mask in place and after said step of implanting said phosphorus with said logic NSD implant mask in place.

9. The method of claim 8, further comprising the steps of performing a final spike anneal after said first final laser anneal, and performing a second final laser anneal after said step of performing said final spike anneal.

10. The method of claim 1, further comprising the step of implanting arsenic with said logic NSD implant mask in place, while said integrated circuit is disposed on a second non-cryogenic substrate holder which is at a non-cryogenic temperature above −25° C. (248° K).

11. The method of claim 10, in which said second non-cryogenic substrate holder is said first non-cryogenic substrate holder.

12. The method of claim 1, in which said memory NMOS transistor is part of a static random access memory (SRAM) cell.

13. A method of forming an integrated circuit, comprising the steps of:

forming a common NSD implant mask so as to expose an area for a logic NMOS transistor and an area for a memory NMOS transistor, and cover an area for a PMOS transistor;

subsequently disposing said substrate on a first cryogenic substrate holder, which is cooled to a first cryogenic temperature;

subsequently implanting an amorphizing species at a first implant beam current density $J_{beam1}$ so as to form amorphous layers in said substrate adjacent to gate sidewall spacers of said logic NMOS transistor and form amorphous layers in said substrate adjacent to gate sidewall spacers of said memory NMOS transistor;

subsequently disposing said substrate on a second cryogenic substrate holder, which is cooled to a second cryogenic temperature;

subsequently implanting arsenic at a second implant beam current density $J_{beam2}$ so as to form arsenic-doped layers in said substrate adjacent to said gate sidewall spacers of said logic NMOS transistor and form arsenic-doped layers in said substrate adjacent to said gate sidewall spacers of said memory NMOS transistor implanting phosphorus while said common NSD implant mask is in place so as to form phosphorus-doped layers in said substrate adjacent to said gate sidewall spacers of said logic NMOS transistor and form phosphorus-doped layers in said substrate adjacent to said gate sidewall spacers of said memory NMOS transistor;

forming a logic NSD implant mask over said substrate so as to expose said area for said logic NMOS transistor and cover said area for said memory NMOS transistor and said area for said PMOS transistor;

subsequently disposing said substrate on a first non-cryogenic substrate holder, which is at a non-cryogenic temperature above −25° C. (248° K);

implanting phosphorus while said logic NSD implant mask is in place so as to form phosphorus-doped layers in said substrate adjacent to said gate sidewall spacers of said logic NMOS transistor.

14. The method of claim 13, further comprising the step of performing an intermediate laser anneal after said steps of implanting arsenic and implanting phosphorus with said common NSD implant mask in place and before said step of forming said logic NSD implant mask.

15. The method of claim 13, further comprising the step of performing an intermediate laser anneal after said steps of implanting phosphorus with said logic NSD implant mask in place and before said step of forming said common NSD implant mask.

16. The method of claim 13, in which said second cryogenic substrate holder is said first cryogenic substrate holder.

17. The method of claim 13, in which said step of implanting phosphorus while said common NSD implant mask is in place is performed while said integrated circuit is disposed on a third cryogenic substrate holder which is cooled to a cryogenic temperature below −25° C. (248° K).

18. The method of claim 13, further comprising the step of performing a first final laser anneal after said steps of implanting arsenic and implanting phosphorus with said common NSD implant mask in place and after said step of implanting said phosphorus with said logic NSD implant mask in place.

19. The method of claim 13, further comprising the step of implanting arsenic with said logic NSD implant mask in place, while said integrated circuit is disposed on a second non-cryogenic substrate holder which is at a non-cryogenic temperature above −25° C. (248° K).

20. The method of claim 13, in which said memory NMOS transistor is part of a SRAM cell.

* * * * *